(12) United States Patent
Lewis et al.

(10) Patent No.: US 12,004,425 B2
(45) Date of Patent: Jun. 4, 2024

(54) THERMOELECTRIC GENERATOR ARRAY

(71) Applicant: ZEVX INC, Gilbert, AZ (US)

(72) Inventors: Richard L Lewis, Mesa, AZ (US); Damon Kuhn, Houston, TX (US); Charles Maury, Mesa, AZ (US); Sean Loehr, Mesa, AZ (US); James Maury, Mesa, AZ (US)

(73) Assignee: ZEVX Inc., Gilber, AZ (US)

( * ) Notice: Subject to any disclaimer, the term of this patent is extended or adjusted under 35 U.S.C. 154(b) by 0 days.

(21) Appl. No.: 17/803,123

(22) Filed: Feb. 18, 2022

(65) Prior Publication Data

US 2023/0270007 A1    Aug. 24, 2023

Related U.S. Application Data

(60) Provisional application No. 63/207,308, filed on Feb. 19, 2021.

(51) Int. Cl.
| | | |
|---|---|---|
| *H10N 10/13* | (2023.01) | |
| *B60L 50/90* | (2019.01) | |
| *B60L 53/20* | (2019.01) | |

(52) U.S. Cl.
   CPC ............. *H10N 10/13* (2023.02); *B60L 50/90* (2019.02); *B60L 53/20* (2019.02)

(58) Field of Classification Search
   CPC .......... H10N 10/13; B60L 53/20; B60L 50/90
   See application file for complete search history.

(56) References Cited

U.S. PATENT DOCUMENTS 4,280,330 A * 7/1981 Harris ................ G05D 23/1919
307/64

* cited by examiner

*Primary Examiner* — Tae-Sik Kang
(74) *Attorney, Agent, or Firm* — Fishman Stewart PLLC

(57) ABSTRACT

A method and system for employing thermoelectric generators for capturing otherwise lost thermal energy associated with operation of an electric vehicle.

7 Claims, 4 Drawing Sheets

THERMOELECTRIC GENERATOR ARRAY

FIELD OF THE INVENTION

The subject invention relates to electric vehicles, and specifically to a means for thermoelectrically generating additional electrical energy and thereby extending the range of the vehicle.

BACKGROUND OF THE INVENTION

Electric vehicles are making inroads into the fleet far more rapidly than had been anticipated. This trend has been accelerated by concerns about climate change, and a consequent desire to minimize the use of fossil fuels and carbon dioxide production. While it is true that the electrical grid used to charge electric vehicles is often supplied by fossil fuels (though less and less by coal), even the cleanest and greenest of fossil fuel generation techniques inevitably produces carbon dioxide. Still, a small number of stationary fossil fueled generation plants are easier targets for emission control than millions of mobile internal combustion engine vehicles. What began with smaller manufacturers and niche vehicles is rapidly spreading. Even Ford Motor and General Motors announced plans to rapidly pivot to an all electric fleet. Electric vehicle sales grew worldwide by 15 percent in 2019 compared to 2018, with even more significant growth in various regions. For example, pure electric sales grew by over 90 percent in Europe, where fossil fuel emission reductions have been stressed far more than in the US. The UK has suggested a ban on all polluting vehicles (anything burning fossil fuels) by 2035. Recent political and economic trends in the US can be expected to bring similar regulatory pressures to bear in the US. The European efforts to mitigate pollution are rapidly increasing as are similar efforts in China.

Electric vehicles are typically roughly divided into the two categories of BEVs, all and only battery driven, and PHEVs, plug in hybrid vehicles, which include a small internal combustion engine to take over when battery capacity runs low. Obviously, pure electrics are preferable from the standpoint of emissions, cost and simplicity, and it is contemplated that they will be essentially 100 percent of the electric vehicle market in the near future.

The trend toward pure electrics has been given further impetus by improvements in charging stations, both home based and commercial, and by improvements in battery technology, in terms of capacity, reliability, operating life, less expensive materials, and weight. Proposed battery improvements fall into several categories. It is proposed to add silicon to the current lithium ion battery to improve charge density. Another proposal is to switch form lithium ion to a lithium iron system, a small change in spelling, but a potentially big change in cost due to the elimination of cobalt, a rare and expensive material. An even bigger change is solid state technology, with lithium electrodes but a solid state ceramic storage medium. A happy synergy would be the use of improved batteries both in vehicles directly, and as excess storage capacity at solar and wind plants to even out the capacity swings, and ease capacity problems on the already stretched grid.

Charging stations increasingly use non contact, inductive charging, which provides a big increase in consumer convenience, even as compared to gasoline pumping stations. The confluence of improved battery technology and non contact charging stations is hoped to provide rapid charging in the 15 minute range, as opposed to overnight waits.

However, it is unlikely that all of these promised or hoped for technologies will come together anytime soon. Even present day technology will certainly bring about a large and accelerating growth, however, and bring with it some inherent problems and drawbacks. Chief among these problems is so called "range anxiety."

Electric vehicles in the near term will be unable to compete with one advantage of fossil fueled vehicles, and that is the massively greater energy density of a tank of a gasoline as compared to a fully charged battery pack. For example, a 15 gallon gas tank can hold up to 500 killowatt hours of available energy, up to six times the available energy of a typical battery array. The liquid fueled IC engine vehicle can both travel faster, find an energy refill more easily and readily, and do that energy refill more quickly. Moreover, the inherent inefficiency of the internal combustion process creates ample high temperature waste heat that can be used for cabin heating, or other purposes in the vehicle. With an electric vehicle, there is no such readily available, high quality source of waste heat. Batteries produce some waste heat, but more so in the summer when it isn't useful. It is far more important to keep batteries cool rigorously, even if it means forgoing some waste heat recovery, for safety reasons. As a practical matter, almost all functions, heating, accessory operation, entertainment etc will have to be drawn from the batteries, directly or indirectly, with a consequent diminution in vehicle range per trip.

One proposal for ICE vehicles is to use the ample waste heat for thermoelectric generation. In general, thermoelectric materials, when subjected to a maintainable thermal differential or gradient (flux) between one end of the material and another, will produce an EMF that can be harvested to run an electrical device directly or, more usefully, charge a battery. Two features are important here. One, that the thermal differential be as great as possible and, two, that the thermal differential be maintainable across the TEG unit, end to end (or side to side). The analogy to a hydroelectric dam is useful. The taller the dam, the greater the distance drop between the top and bottom for the restrained water, and the greater the force with which a turbine is driven and the greater the generation potential. But just as important is that the height differential be dynamically maintained. Water from a higher level must be continually available and replenished. Water exiting the turbine at the lower level must be continually exhausted and drained away to make room for more from above. Draining water from a full, static lake into an empty static lake would work only until an equilibrium of levels was attained. That is why river and dam is needed. The elevated level of the river above (reservoir) is essentially continually maintained, as is the lower, drained water below. The useful differential is dynamically and continually maintained, at essentially no cost, apart from initial installation. Even a "short dam" can be useful. In fact, the genesis of that energy producing differential can be understood to be solar, as the falling water reached that higher level by virtue of solar evaporation. The solar genesis is true for essentially all useful energy on earth, including wind and stored fossil fuels, apart from nuclear.

ICE vehicles, in operation, create and provide something very like that dynamically and continually maintained thermal differential, especially when operating. Engine blocks are very hot, and must be continually cooled. Engine exhaust is comparably hot, and typically dumped to the ambient without extracting any useful work, barring driving of a turbocharger.

There are proposals to extract electrical energy from these thermal differentials found in ICE engine cars. U.S. Pat. No. 10,823,111 proposes to create a diversion passage in the exhaust system to heat TEG units (thermoelectric generation units), or, more accurately, one end thereof. The other of which would be continually cooled by the relatively U.S. Pat. No. 9,842,978 proposes to do the same using the heated engine block itself as the heat source. It seems unlikely that, in an ICE engine car, with its essentially unlimited range and conventional electrical generation capacity, that any such design would ever be economically feasible.

The situation is very different for pure electric vehicles. Harvesting power at the margins, exploiting the so called short dams, could be very useful. But as there is no even remotely comparable source of "free" high quality waste heat, it is difficult to imagine how that might be done, even with existing or off the shelf TEG technology.

There are proposals to use low quality heat, even just body heat, to power small, low current electric appliances, such as smart watches. These systems would not be feasible for EVs.

SUMMARY OF THE INVENTION

The subject invention makes use of existing TEG units and technology in a novel way to harvest electrical energy from a dynamically maintainable thermal gradient. That dynamic differential is formed at one end, in one embodiment, by an ambient heat source, the relatively high heat of summer sun and/or summer air. The other side of the differential is a relatively colder source, such as the cooler air inside a moving and air-conditioned vehicle, or the air in the natural shade existing inside or beneath a parked vehicle. Again, this cooler air heat sink is a dynamically maintained and essentially freely available source, just as the hotter air source is.

An array of TEG units has a "hot end" thermally conductively exposed to the heat source, such as a solar irradiated metal roof panel. The "cold end" of the TEG unit is thermally exposed to a source of relatively cooler air, such as air from the ambient, or cooled air from the vehicle interior, that is continually exhausted anyway and can be provided continually, as by a channel formed beneath the roof panel. The TEG unit generates an electric current as this thermal differential is maintained, which can be harvested, either to run a low power appliance directly, or to charge a battery therefore, or both. A sufficient number of such TEGs in series, coupled with a suitable DC-DC converter, could achieve and calibrate voltages sufficient to directly charge traction batteries.

Likewise, in another embodiment, a separate array of reverse acting TEG units could be provided with a "cold end" thermally conductive to a cold sink, such as the same roof panel exposed to cold winter air. The "hot end" would then be exposed to a dynamic source of hotter air from the vehicle interior. The key word here is "hotter" in the relative, not the absolute sense. In either case, a temperature gradient is formed between the ambient air (warmer or cooler) and the vehicle interior (conversely cooler or warmer) to form the harvestable and continuously maintainable temperature differential or gradient.

Whenever that relative, dynamically maintainable differential of "hotter" and "colder" is available, it could be potentially harvested. And the hotter and colder sides of that differential would change season to season, or even over the course of a day, given changing conditions. It is within the spirit of the invention here to anticipate and switch modes so as to harvest all of these potential opportunities as they arise.

DETAILED DESCRIPTION OF THE PREFERRED EMBODIMENTS

It is helpful at this point to describe some more background about thermoelectric generation and existing devices, which are incorporated into the designs described below.

Figure 1:
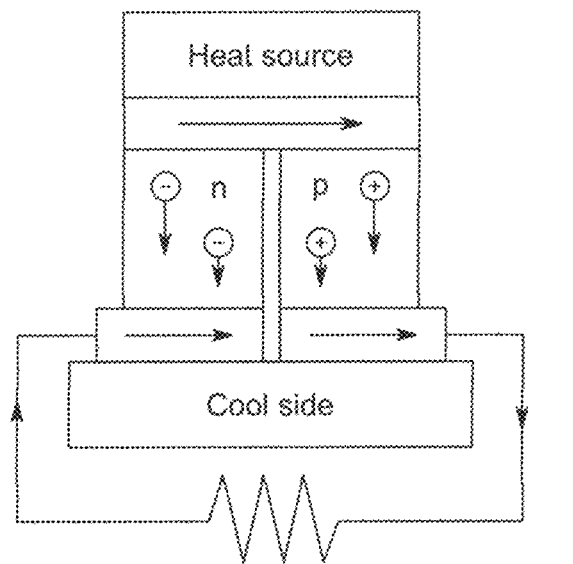
FIG. 1 illustrates a TEG electric generator schematic and device.
Figure 1:
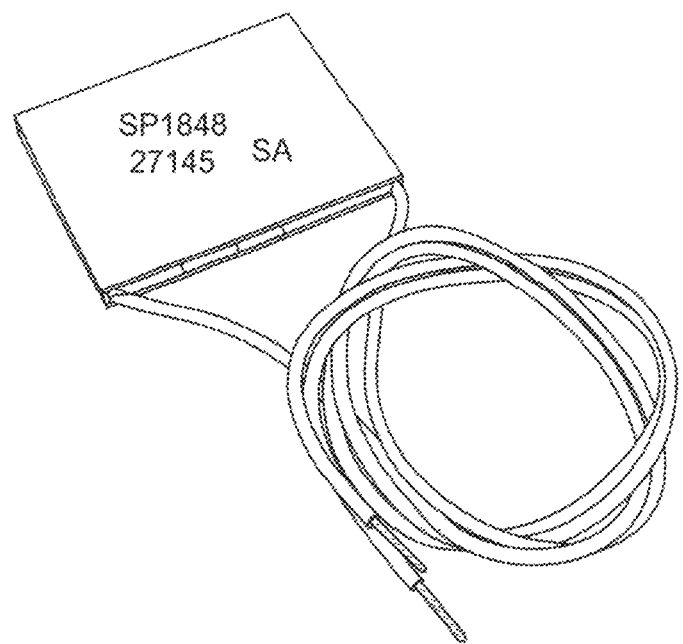

The basic operation of a thermoelectric module (TEG) is illustrated in FIG. 1. Two different material elements, shown on the left of FIG. 1, an n-doped element, and a p-doped element, are arranged electrically in series, but thermally in parallel, between a dynamic heat source and a dynamic heat drain, or cooler source. All of the n and p elements are connected at their upper ends (or, at one end, to avoid any implication of orientation limitation) by a thermally and electrically conductive means to the heat source, and thermally conductively connected (only) at their lower (other) ends to the cooler source. It is important the n and p elements per se maximize electrical conductivity, while limiting thermal conductivity. This is important so as to maximize charge flow, while minimizing the end to end thermal flow that would tend to reduce the driving thermal differential or gradient (flux). The doping serves to increase electrical conductivity, while not increasing thermal conductivity per se. These elements are incorporated in commercially available TEG units, shown on the right in FIG. 1, which may be wired in large numbers in series, as described further below.

The conventional wisdom for TEGs is that only a very large thermal differential or flux is useful. It is true that efficiency and capacity increase proportionately to the size of that thermal differential. There is also a perception that, in an engineering sense, that large differential, especially the high temperature at the hotter side, will subject the units to a high degree of thermal and mechanical stress. That hotter side is also, certainly in the case of IC engine vehicles, a very hot and very caustic environment, subject to a great deal of flux, making the thermal connection at the hot side subject to durability issues. The subject invention works against that received wisdom, as will be detailed below.

Conventional materials for the n and p elements are chosen based on the temperatures that are likely to be experienced. One common material is Bismuth Telluride ($Bi_2Te_3$), which is effective around room temperature. As noted, while large temperature differentials cannot be expected to either side of room temperature, the subject invention works in spite of, and even with, what would otherwise be considered a drawback.

Preferred embodiments according to the invention are described by reference to the figures.

The invention is designed to work in conjunction with a vehicle structure that can serve either as a source of heat energy from the ambient, or as a "sink" or drain of heat to the ambient. This interchangeability can occur seasonally, of course, but can even occur within a day during a given season. This either/or use of an ambient source/sink is not one that is recognized in those few sources that suggest the use of TEGs in a vehicle context, which, so far as is known, disclose only the use of a structure that is a source of high temperature heat energy only, and which does not change seasonally. Likewise, only the use of high heat flux or differential is contemplated, and only in problematical areas (engine block, exhaust system) that would be difficult to exploit as a practical matter. By stark contrast, the subject invention seeks to harvest energy at the margins and use a lower heat flux, in conjunction with a novel method of taking advantage of a variability in that flux, and in a structural context that is far more durable and practical.

Figure 3:
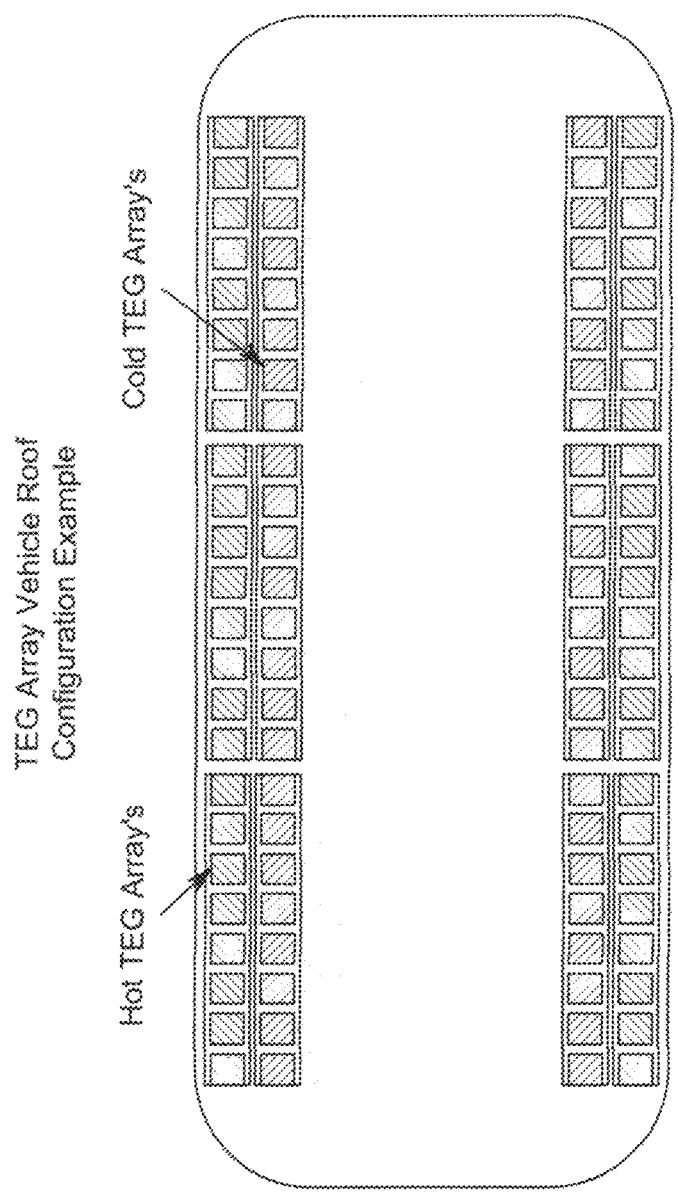
FIG. 3 illustrates a TEG array on a vehicle roof.

As illustrated in FIG. 3, a suitable vehicle body structure is chosen that provides the necessary ambient exposure to hot or cold, and also a practical means of dynamically maintaining an opposite side of the necessary heat flux. For example, the metal roof structure of a typical vehicle, including EVs, is continually exposed to the ambient, and has a relatively large surface area. That ambient exposure is static when the car is parked, and dynamic when it is operating, but continual in either case. An array of TEGs of the type shown in FIG. 1 may be mounted in the space beneath the underside of the roof panel, in a thermally conductive fashion, as shown in FIG. 3. For example, only an array of "hot" TEGs, that is, ones in which the hot side shown in FIG. 1 could be thermally connected to the underside of the roof panel heat source. This could make sense in an area where only relatively hot ambient temperatures are expected, that is, relatively hotter than the interior cabin of the vehicle. A large array of such TEGs could be ganged together in series, and most of the available under roof mounting area could be used. Each unit would be suitably electrically insulated from the other. The relatively hotter upper and outer surface of the roof panel, in an environment like the American southwest, would be hot even when the vehicle was moving, and even hotter when sitting parked in the beating sun. The surface can be considered to be exposed to the ambient air, even when the primary mechanism of exposure thereto is radiant, (from solar rays) and not convectively, as when the vehicle was moving.

Figure 2:
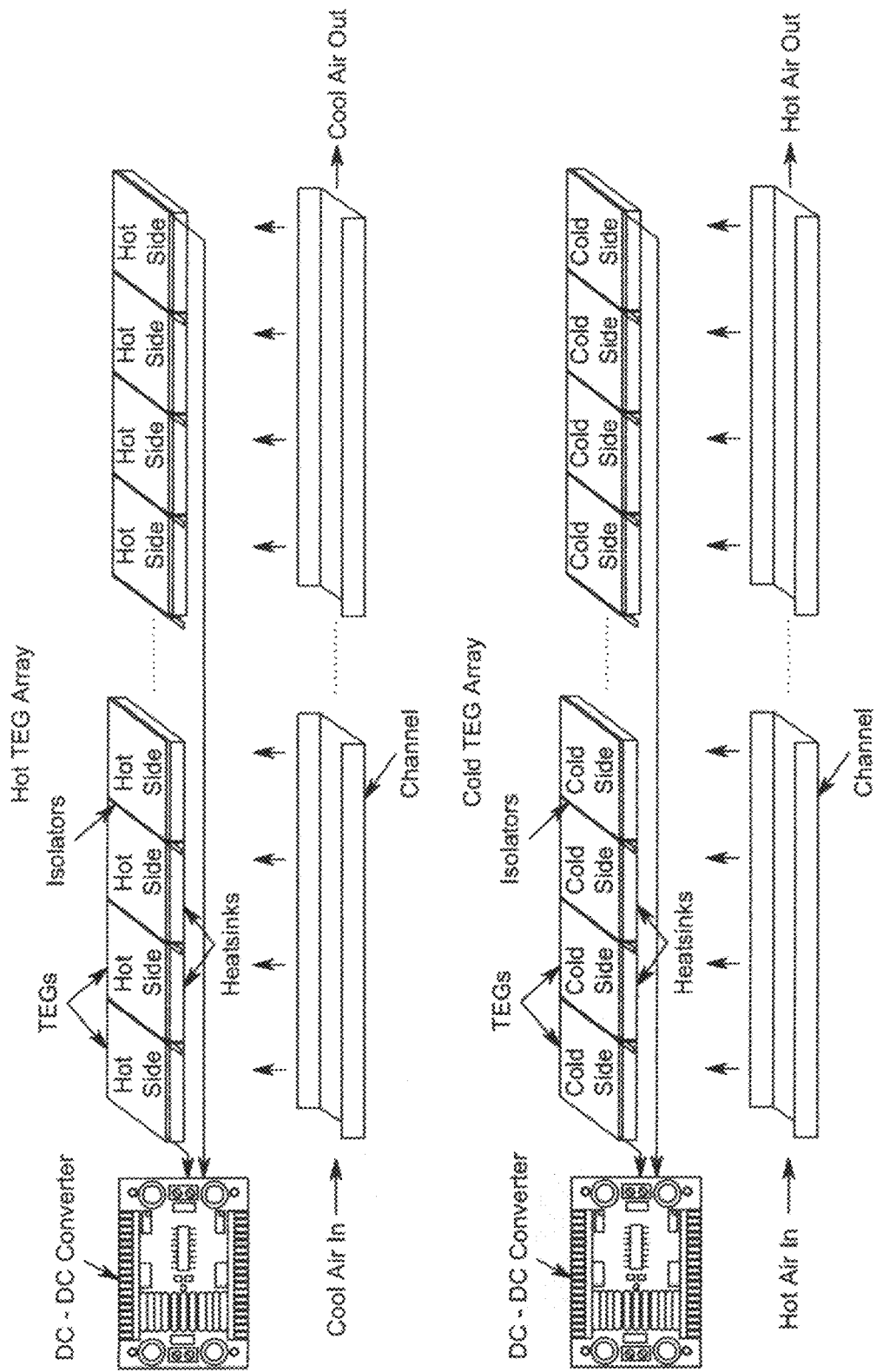
FIG. 2 illustrates hot and cold TEG arrays.

As best shown in FIG. 2, in the available volume below the roof underside mounted TEG array, a channel could be provided for a cooling air flow to the opposite, cool side of the TEG array. This flow channel need not be deep, and there would be sufficient volume available inside the vehicle head liner, or the headliner itself could provide the flow channel. That flow channel would be fed with relatively cooler air, as from the vehicle interior. Such vehicle interior air is typically dynamically cooled regardless, and continually expelled as it becomes stale and fresh air is drawn in. The expelled air could be fed past the cold side of the hot array, and thus the heat flux dynamically maintained, essentially for free. In addition, relatively cooler outside air could be ducted into the cooling space beneath the colder side of the hot TEG array, for the express purpose of providing and maintaining that heat flux (dynamic temperature gradient or differential). Such outside air could effectively be kept out of the cabin interior so as to not interfere with its air conditioning. Both sources of cooling air could be blended as needed and, again, both would be essentially free.

When the car is parked, the cooler side air flow would not be readily available from the vehicle's cooling system. The other side of that coin, however, is that the roof could become very hot indeed, primarily from radiant solar heating and it is the temperature differential that's significant. The car interior is typically cooler, just by virtue of being shaded (by that same roof) and or by tinted windows. Extra interior shading is often provided by vehicle owners, as by front window screens, and such screening could be automatically provided as an adjunct to the subject invention. Furthermore, some systems could be designed to periodically cool the interior air as the car was parked, either actively and passively, and that relatively cooler air could be used, in conjunction with a very hot roof, to create the necessary heat flux and exploit it. In addition, ambient air could be pulled in from the shaded area beneath the car as the car was parked and ducted beneath the hot TEG array.

Regardless of the various potential means for providing the cooling air necessary to maintain the flux, the total current and voltage so provided could be used in several possible ways. It could directly power its own fans or valves or control systems, and use the excess power to directly power other vehicle accessories, or to charge lower power batteries for such accessories. Furthermore, with the addition of a converter, such as that shown in FIG. 4 below, the total voltage could be stepped up and boosted to a level sufficient to charge the traction batteries. For example, if each TEG produced a maximum of 5 volts and a TEG array consisted of 8 TEG's then the array would provide an output of 40 volts. This could then be regulated and calibrated to provide an output of 48 to 50 volts, as desired. This additional operation would also use energy, of course, but there would be conditions under which the temperature flux could be sufficient to make such boosting feasible.

Figure 4:
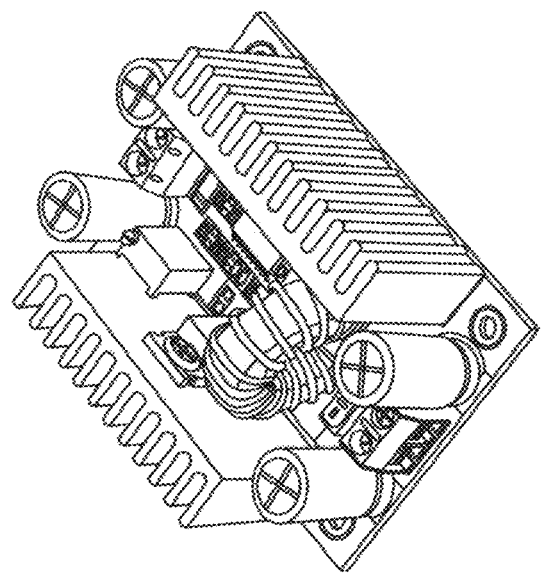
FIG. 4 illustrates a power supply and heat exchangers suitable for use in implementing another embodiment of the invention.
Figure 4:
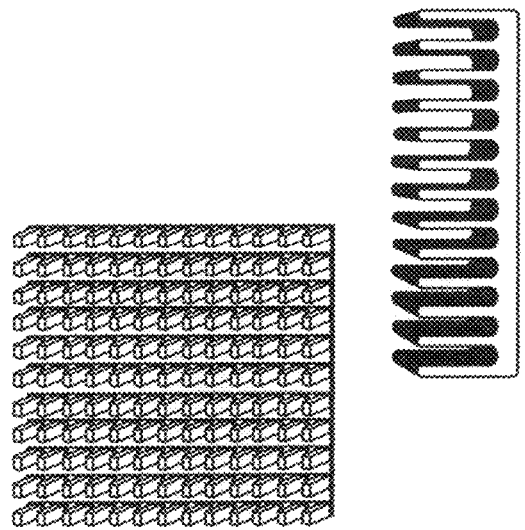

It is the unique advantage of the subject invention to recognize and exploit the ever changing "short dams" of potential thermal energy that develop between the ambient air and the vehicle interior air. The prior art suggests the use of a free or waste heat source in a vehicle, but not the use of an ambient heat source as disclosed above. The prior art on the use of TEGs in vehicle is even less suggestive of the use of an ambient cold source in relation to a relatively warmer heat source within the vehicle cabin. In cold climates, or during the cold season in moderate climates, the same roof panel would become very cold, especially when parked in the shade, and especially when exposed to a cold air stream as the vehicle was driven. An additional (or potentially only) array of "cold' TEGs could be incorporated. These would be installed as shown in FIGS. 3 and 4 above, but with the cooled side thermally conductively joined to the underside of the roof panel. Then, in cold weather, there would be a temperature differential created relative to the now warmer interior cabin air of the vehicle, which would be ducted to the warmer side of the TEG array. The deliberately heated air in the cabin vehicle also has to be continually evacuated as it becomes stale, and that still warm exhausted air could be so ducted. A suitable temperature sensing control system would be provided to switch between arrays depending on ambient and interior temperatures, and use whatever temperature gradient was available. The system could potentially be designed to switch even as conditions changed on a daily basis. For example, in winter, the greenhouse effect can warm the vehicle interior significantly relative to the outside of the roof panel. Though the differential so created might not be large, both the heat and cold source are free, and could last for a long time as the vehicle was parked.

The control system could be designed to detect the size of and direction of such thermal differentials or gradients (flux) and automatically switch between arrays as needed. The system as disclosed could work in any vehicle, including an IC engine vehicle, though it would be most economically feasible in an all-electric vehicle.

The invention and system as disclosed are subject to variations and improvements. In addition to using only one array, hot or cold depending on geographic environment, two arrays of varying size could be used, a smaller hot side array where the hot weather heat flux is higher (and fewer TEG elements needed), and vice versa. A cold side array could be mounted in an area likely never to see any solar heating, such as a side panel. New nano materials may be developed in the future that are more efficient than the off the shelf units disclosed above, and those could easily be substituted.

The invention claimed is:

1. A system for thermoelectric generation in a vehicle, comprising,
    at least one thermoelectric generating element associated with a vehicle body with one side thermally conductively exposed to a relatively warmer exterior ambient air having an ambient temperature,
    a flow structure to supply the other side of the at least one thermoelectric generating element with a relatively cooler air flow, so as to dynamically maintain a thermal gradient across said element; and
    wherein said relatively cooler air flow is supplied by interior waste air from a cooling system of said vehicle.

2. The system according to claim 1, in which said one side of the at least one thermoelectric generating element is associated conductively with a vehicle roof panel.

3. The system according to claim 2 in which, while said vehicle is stationary, exposes the vehicle roof panel to solar radiant heating.

4. The system according to claim 3 in which said relatively cooler air flow is supplied from an exterior of said vehicle from a source cooler than a heated roof panel.

5. A system for thermoelectric generation in a vehicle, comprising,
    at least one thermoelectric generating element array associated with a vehicle body with a hot side associated with a vehicle body panel and thermally conductively exposed to the ambient air having an ambient temperature,
    at least one thermoelectric generating element array associated with said body panel with a cold side associated with said vehicle body panel,
    a flow structure associated separately with each to supply the other side of said thermoelectric generating element array with an air flow of differing temperature, so as to dynamically maintain a thermal gradient across said element,
    and a control means to switch between the at least one thermoelectric generating element array associated with the vehicle body with the hot side associated with a vehicle body panel and the at least one thermoelectric generating element array associated with said body panel with the cold side associated with said vehicle body panel depending on changing ambient temperatures to which said vehicle body panel is exposed.

6. The system according to claim 5 is which said vehicle body panel is a roof panel.

7. The system as claimed in claim 5 wherein the at least one thermoelectric generating element array associated with said body panel with the hot side associated with said vehicle body panel has a first size, and
    wherein the at least one thermoelectric generating element array associated with said body panel with the cold side associated with said vehicle body panel has a second size different from said first size.

* * * * *